US009395508B1

United States Patent
Dailey et al.

(10) Patent No.: US 9,395,508 B1
(45) Date of Patent: Jul. 19, 2016

(54) INTERCHANGEABLE RACK SYSTEM

(75) Inventors: William Dailey, Redwood City, CA (US); Winnie Leung, Palo Alto, CA (US); Angela Ying-Ju Chen, San Francisco, CA (US); Michael John Bliss, Santa Clara, CA (US)

(73) Assignee: Google Inc., Mountain View, CA (US)

( * ) Notice: Subject to any disclaimer, the term of this patent is extended or adjusted under 35 U.S.C. 154(b) by 566 days.

(21) Appl. No.: 13/345,147

(22) Filed: Jan. 6, 2012

(51) Int. Cl.
G02B 6/44 (2006.01)

(52) U.S. Cl.
CPC ............ G02B 6/4471 (2013.01); *G02B 6/4452* (2013.01)

(58) Field of Classification Search
CPC ........ A47B 57/30; A47B 57/40; A47B 57/44; A47B 88/044; A47B 97/00; H05K 7/1489; H05K 7/1491; H05K 7/1492; H05K 7/16; G02B 6/4471; G02B 6/4452; A47F 7/00
USPC ......... 211/26, 186, 187, 189, 190; 312/223.2, 312/265.3–265.6, 265.1; 361/679.58
See application file for complete search history.

(56) References Cited

U.S. PATENT DOCUMENTS

| | | | | |
|---|---|---|---|---|
| 3,655,063 A * | 4/1972 | Landry | ......................... | 211/41.2 |
| 4,588,096 A * | 5/1986 | Story et al. | ............... | 211/126.15 |
| 5,259,668 A * | 11/1993 | Teufel et al. | ............. | 312/249.11 |
| 5,574,251 A * | 11/1996 | Sevier | .............................. | 174/50 |
| 5,644,993 A | 7/1997 | Dohnalik | | |
| 5,829,767 A * | 11/1998 | Grossman | .................. | 280/47.35 |
| 6,422,399 B1 * | 7/2002 | Castillo et al. | ................... | 211/26 |
| 6,513,770 B1 * | 2/2003 | Franz et al. | .................... | 248/200 |
| 6,591,997 B2 | 7/2003 | Hung | | |
| 7,529,097 B2 * | 5/2009 | Coglitore et al. | ............... | 361/725 |
| 7,672,561 B1 * | 3/2010 | Keith et al. | .................... | 385/135 |
| D639,010 S * | 5/2011 | Barnts et al. | ................... | D34/21 |
| 8,978,900 B2 * | 3/2015 | Westphall et al. | .............. | 211/26 |
| 2011/0133620 A1 * | 6/2011 | Coglitore et al. | ............ | 312/326 |
| 2012/0112611 A1 * | 5/2012 | Chen et al. | ................. | 312/223.2 |
| 2013/0208420 A1 * | 8/2013 | Franklin | ....................... | 361/695 |

* cited by examiner

*Primary Examiner* — Korie H Chan
(74) *Attorney, Agent, or Firm* — Lerner, David, Littenberg, Krumholz & Mentlik, LLP

(57) ABSTRACT

Aspects of the disclosure relate generally to rack systems for housing computing devices. The rack may include shelves supported by flanges of a pair of corresponding inserts. The flanges may be spaced along the length of each of the inserts. The distance between the flanges may define the height of a shelf when placed in the rack. The pair of corresponding inserts may be placed along an inner sidewall of the rack by mating hooks of the inserts with corresponding slots of the inner sidewall and subsequently removed by demating the hooks and slots. For example, a pair of inserts with one distance between the flanges may be replaced by a pair of inserts with another distance between the flanges in order to increase the shelf height of the rack. By replacing the shelves and/or the inserts, a user may quickly and easily in order to reconfigure the rack.

15 Claims, 14 Drawing Sheets

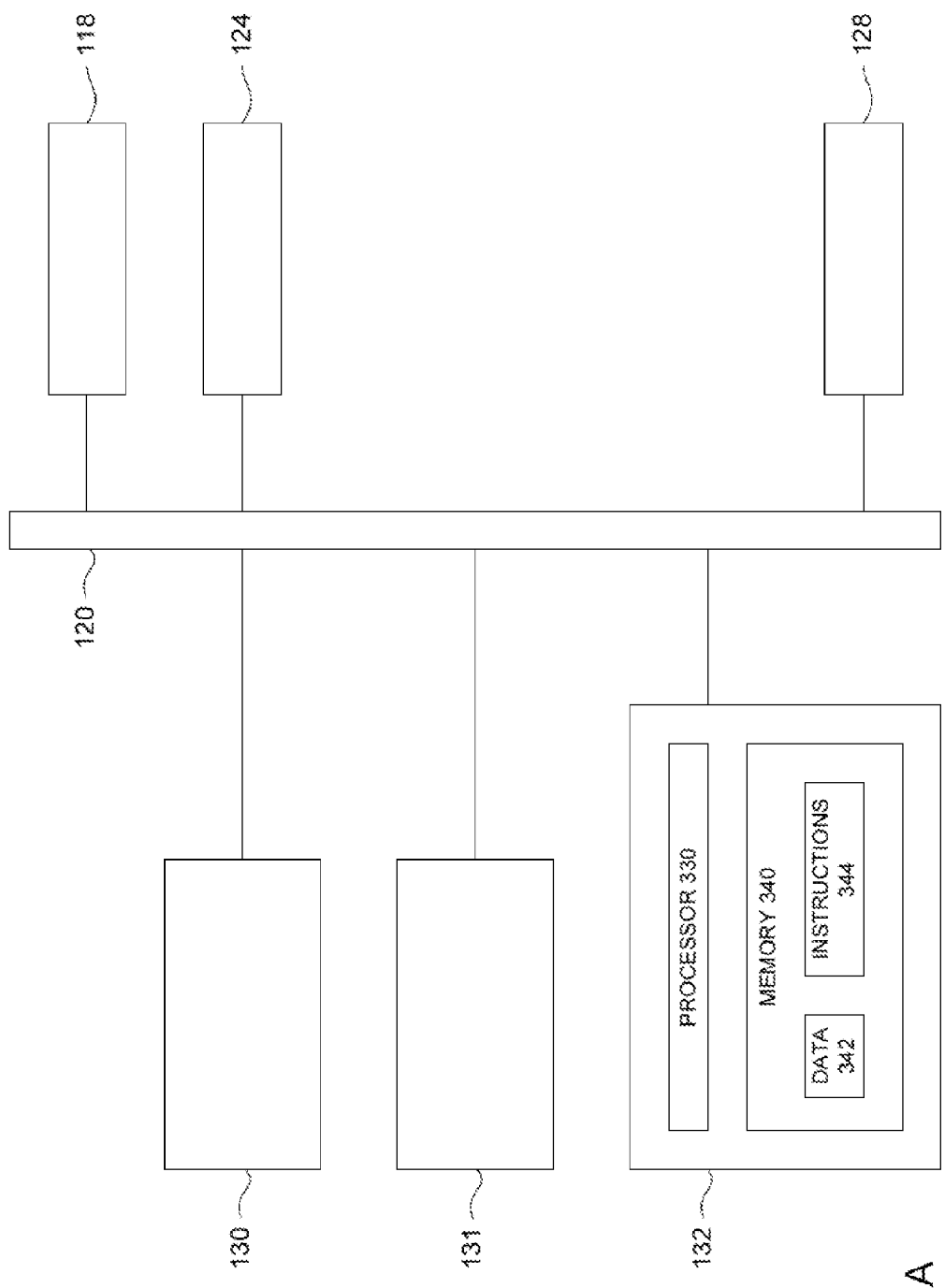

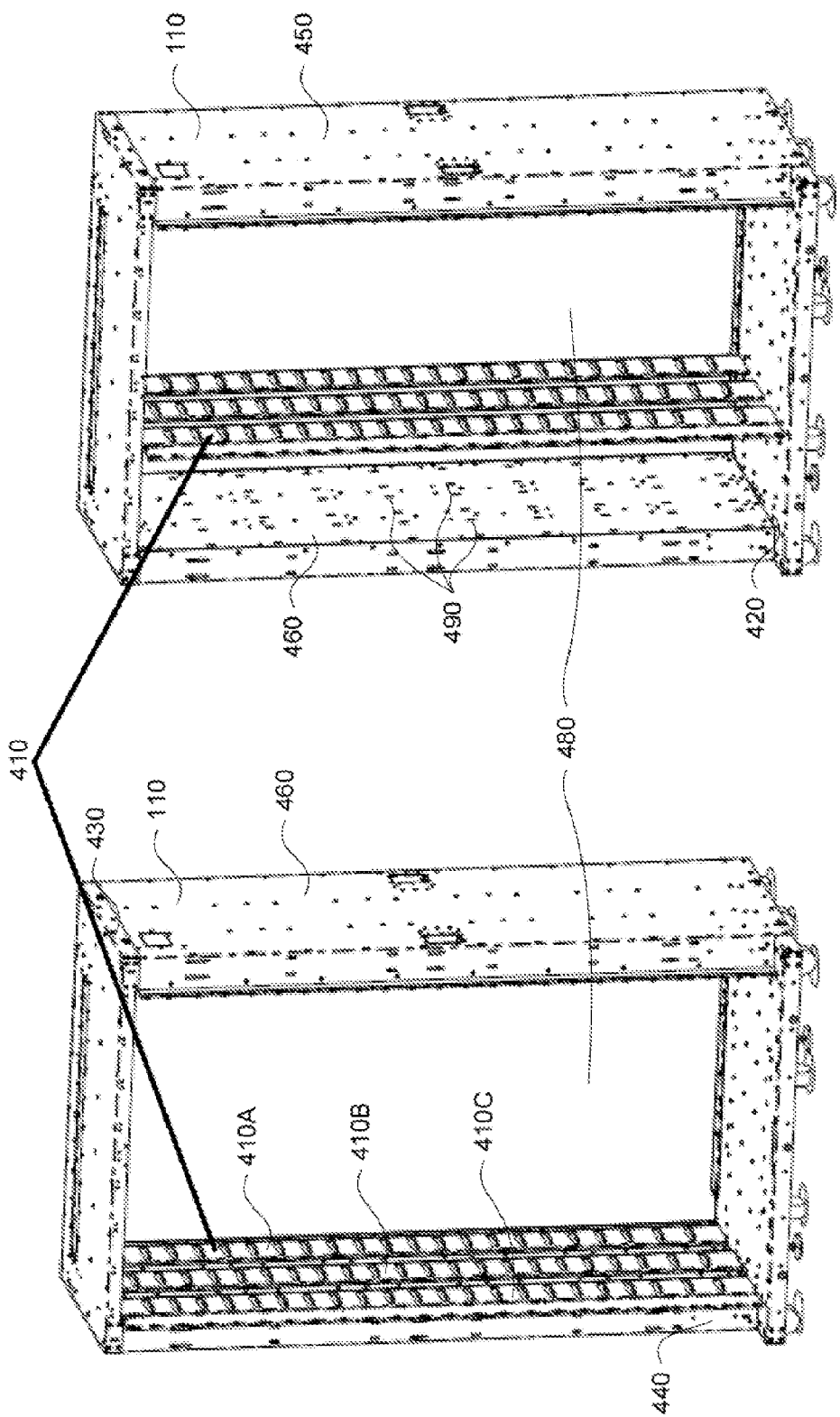

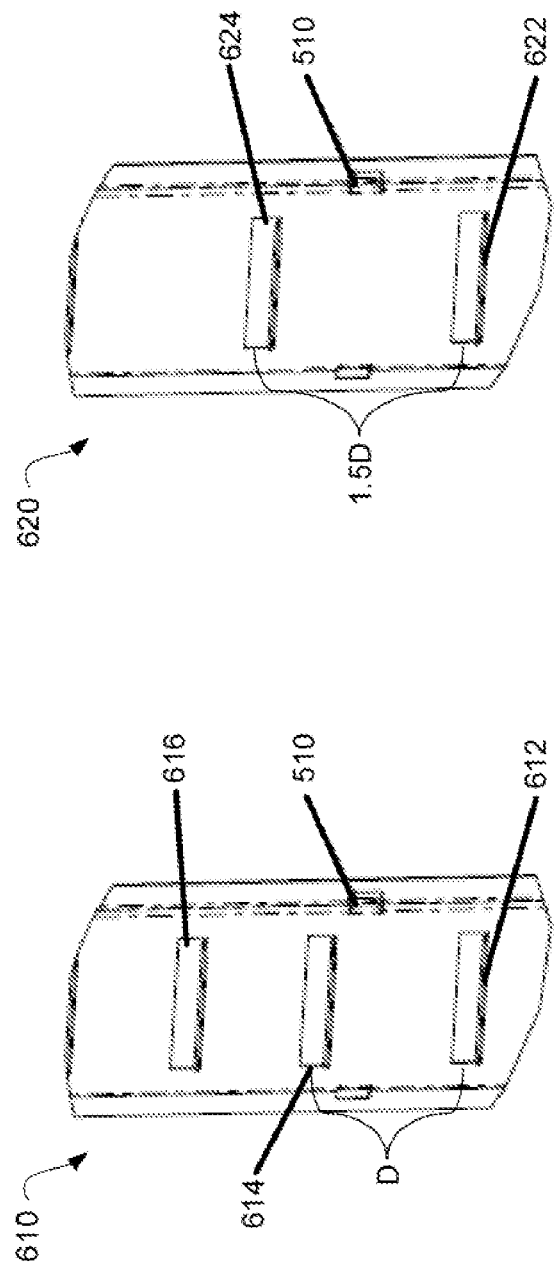

INTERCHANGEABLE RACK SYSTEM

BACKGROUND

Corporations operating large-scale computing systems invest significant amounts of capital to establish and maintain the hardware necessary to house the computing systems. For example, some computing systems may include a plurality of racks for holding computing devices such as hard drives or entire servers. These racks are typically very expensive to purchase and come in a few standardized sizes.

Because only a few sizes are available, it may hamper the ability of these companies to adopt more efficient architectures. For example, if new, more efficient server devices of different shapes and sizes become available, it may be very difficult to rearrange a standard rack to accommodate the different shapes. In other words, even if devices become 25% smaller, the same rack may not actually be able to hold more devices because the shelves, etc. cannot be rearranged without essentially being rebuilt. Thus, in order to obtain the maximum benefits of new developments in computing devices, the company may be forced to invest in new racks, which can be costly and inefficient.

SUMMARY

One aspect of the disclosure provides a method of reconfiguring a rack. The rack includes a first shelf for holding one or more computing components. The method includes removing the first shelf from the rack and removing a first set of corresponding inserts from the rack. Each insert of the first set of corresponding inserts has a plurality of flanges spaced at a first flange distance. At least some of the plurality of flanges are configured to support the first shelf. The rack is reconfigured by placing a second set of corresponding inserts into the rack. Each insert of the second set of corresponding inserts has a second plurality of flanges spaced at a second flange distance different from the first flange distance. The reconfiguration also includes placing a set of shelves on the second set of corresponding inserts such that the set of shelves are supported by at least some of the second plurality of flanges. The reconfiguration also includes placing one or more replacement computing components on the set of shelves.

In one example, removing the first shelf from the rack also includes sliding the first shelf over the at least some of the plurality of flanges. In another example, a first insert of the first set of corresponding inserts includes a set of hooks and the rack further includes a first side wall having a first inner surface, the first inner surface includes a plurality of slots configured to receive and release the set of hooks, and removing the first set of corresponding inserts includes releasing the set of hooks from the plurality of slots. In another example, the rack further includes a cap and a base, the first sidewall has a length that spans from the cap to the base, and removing the first set of corresponding inserts also includes moving the first insert towards the cap and away from the base. In this example, each hook of the set of hooks is associated with a corresponding slot of the plurality of slots and wherein removing the first set of corresponding inserts further includes moving the insert away from the first inner surface thereby moving each hook of the set of hooks through the corresponding slot of the plurality of slots. In another example, a first insert of the first set of corresponding inserts includes a first set of hooks arranged in a first configuration, a second insert of the second set of corresponding inserts includes a second set of hooks arranged in the first configuration, the rack further includes a first side wall having a first inner surface, the first inner surface including a plurality of slots configured to receive and release hooks arranged in the first configuration, and placing the second set of corresponding inserts into the rack includes lining up each hook of the second set of hooks with a corresponding slot of the plurality of slots. In this example, placing the second set of corresponding inserts includes moving each hook of the set of hooks through the corresponding slot of the plurality of slots. In addition, placing the set of corresponding inserts includes moving each hook of the set of hooks towards the base and away from the cap until each hook is supported by a portion of the first side wall adjacent the corresponding slot of the set of slots. In another example, placing the set of shelves includes sliding a second shelf over the at least some of the second plurality of flanges. In another example, the method also includes removing the one or more computing components from the first shelf. In another example, the method also includes after placing the set of shelves on the second set of corresponding inserts, screwing a screw through a shelf of the first set of shelves and into an insert of the second set of corresponding inserts. In this example, removing the first shelf further comprises removing a second screw from the first shelf that holds the first shelf to an insert of the first set of corresponding inserts.

Another aspect of the disclosure provides a kit adapted for assembly into a plurality of different rack configurations for housing one or more computing components. The kit includes a rack having a first side wall having a first inner surface. The first inner surface includes a plurality of slots. The kit also includes a first pair of corresponding inserts having a first set of hooks and arranged to mate with the plurality of slots. The first set of corresponding inserts has a the plurality of flanges spaced at a first flange distance for accommodating shelves of a first height between the inserts of the first pair of corresponding inserts. The kit also includes a second pair of corresponding inserts having a second set of hooks. The second set of hooks is arranged to mate with the plurality of slots, and the second pair of inserts has a plurality of flanges spaced at a second flange distance for accommodating shelves of a second height. The second flange distance being different from the second flange distance.

In one example, the kit also includes a set of shelves, where each shelf of the set of shelves having a different configuration for supporting a computing component and the set of shelves includes a first shelf of the first height. In this example, the set of shelves includes a second shelf of the second height. In another example, the rack also includes a bus bar for supply power to a shelf of the set of shelves. In another example, the first and second sets of hooks are both arranged in a first configuration, and wherein the plurality of slots are configured to receive and release hooks arranged in the first configuration.

A further aspect of the disclosure provides a rack assembly for housing one or more computing components. The rack assembly includes a rack with a first side wall having a first inner surface and a second side wall having a second inner surface opposite of the first inner surface. The first inner surface including a plurality of slots. The rack assembly also includes a pair of corresponding inserts. A first insert of the pair of corresponding inserts has a first set of hooks that extend through the plurality of slots in the first inner surface and hold the first insert to the first inner surface. The first insert has a first plurality of flanges spaced at a flange distance. The pair of corresponding inserts also includes a second insert having a second set of hooks that extend through the plurality of slots in the first inner surface and hold the second insert to the second inner surface. The second insert has a second plurality of flanges spaced at the flange distance. The rack assembly also includes a shelf supported at one edge by a flange of the first plurality of flanges and at another edge by a flange of the second plurality of flanges.

In one example, the rack assembly also includes one or more computing components situated on the shelf. In another example, the rack also includes a cap and a base, wherein the first sidewall has a length that spans a distance between the cap and the base and the first insert has a length that is less than the distance between the cap and the base. In another example, the rack assembly also includes a first screw going through the shelf and into the first insert in order to further support the shelf and a second screw going through the shelf and into the second insert in order to further support the shelf. In another example, the pair of corresponding inserts are configured to be interchanged with another pair of corresponding inserts.

BRIEF DESCRIPTION OF THE DRAWINGS

FIGS. 3A-3B are system diagrams of example components.

FIGS. 4A-4D are example diagrams of a rack architecture in accordance with an implementation.

FIGS. 6A and 6B are additional example diagrams of g

DETAILED DESCRIPTION

Figure 1A:
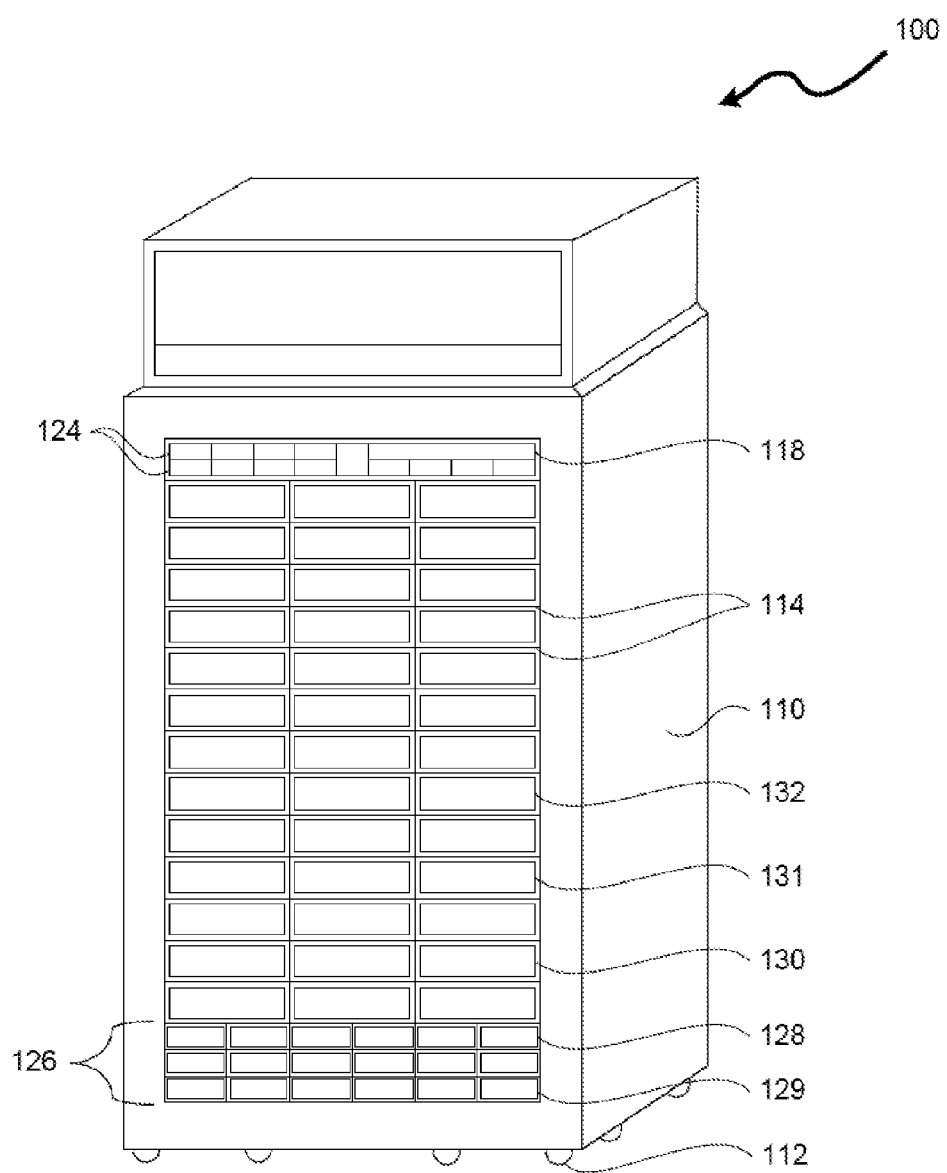
FIGS. 1A-1B are example diagrams of rack architectures in accordance with aspects of the disclosure.
Figure 1B:
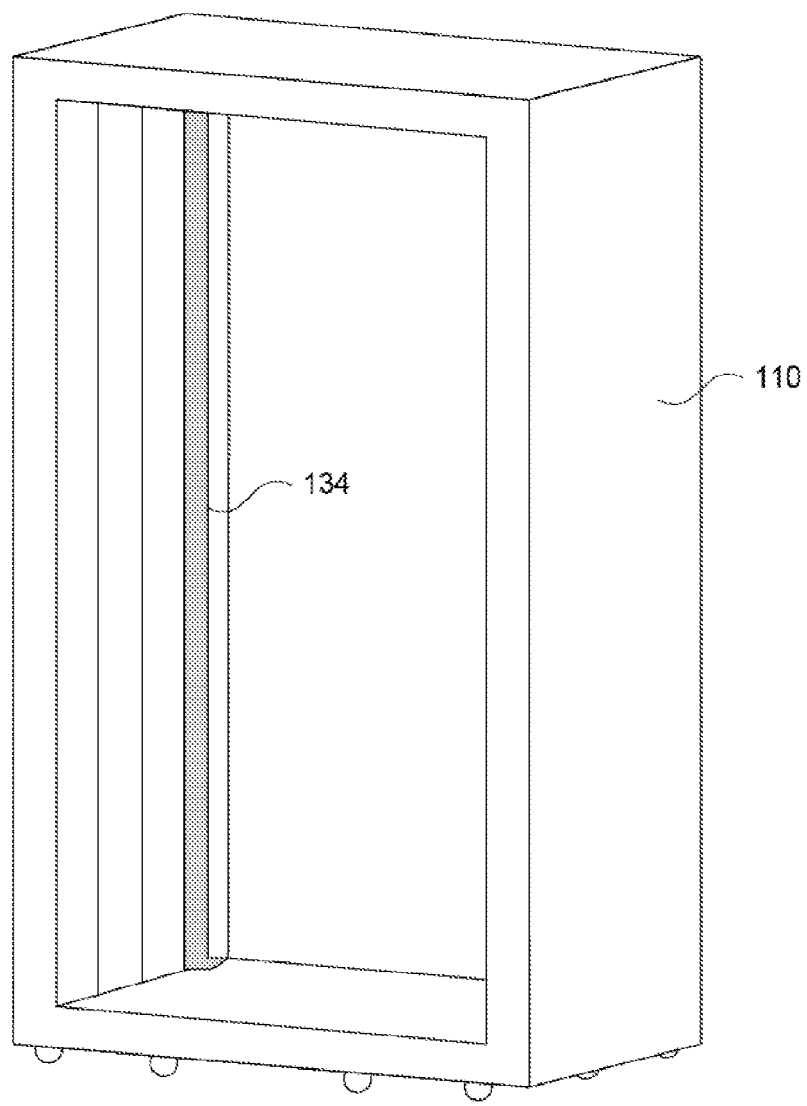

FIGS. 1A and 1B are examples of a mobile rack system. FIG. 1A depicts a server system 100 that may include a mobile rack 110 having wheels 112, a plurality of shelves 114 for holding components, a rack monitoring unit (RMU) 118 for monitoring the status of the features of the rack, a plurality of rectifiers 124, a battery backup 126, battery boxes 128, 129, and a plurality of computing components 130-132. FIG. 1B is an example of rack 110 of FIG. 1A without shelves 114. In this figure, it can be seen that the rack 100 includes a main bus bar 134.

The server system 100 supplies power from a power source to the computing components. For example, though not shown in the figures, each of the shelves of the rack may be connected to a power supply such, as an AC or DC power source, by way of main bus bar 134. The main bus bar 134 may also be connected to each shelf of the rack in order to provide power and data to the components or battery boxes.

Figure 2:
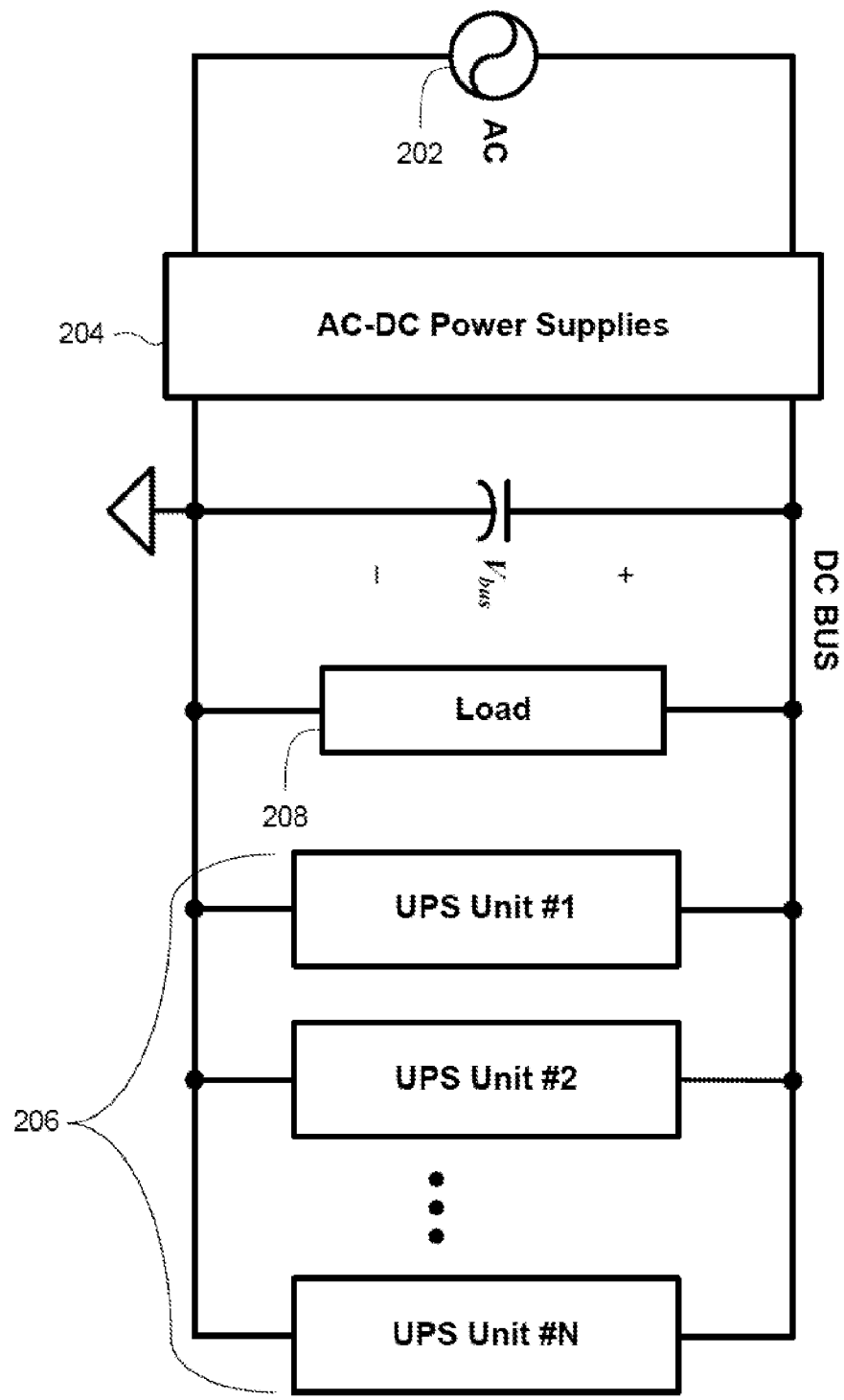
FIG. 2 is an example diagram of power architecture in accordance with aspects of the disclosure.

FIG. 2 is an example of a power architecture for the server system 100. An AC power source 202 may be connected to the rectifiers 124. In this example, the rectifiers 124 may include 48 volt AC to DC rectifiers 204. The rectifiers are connected to the main bus bar 134 and supply power to a load 208 (including components 130-132 of FIG. 1A). The load 208 is connected in parallel to a plurality of uninterruptable power supply units (PSU) 210 (battery boxes 128, 129 of FIG. 1A) which make up the battery supply 126.

Figure 3B:
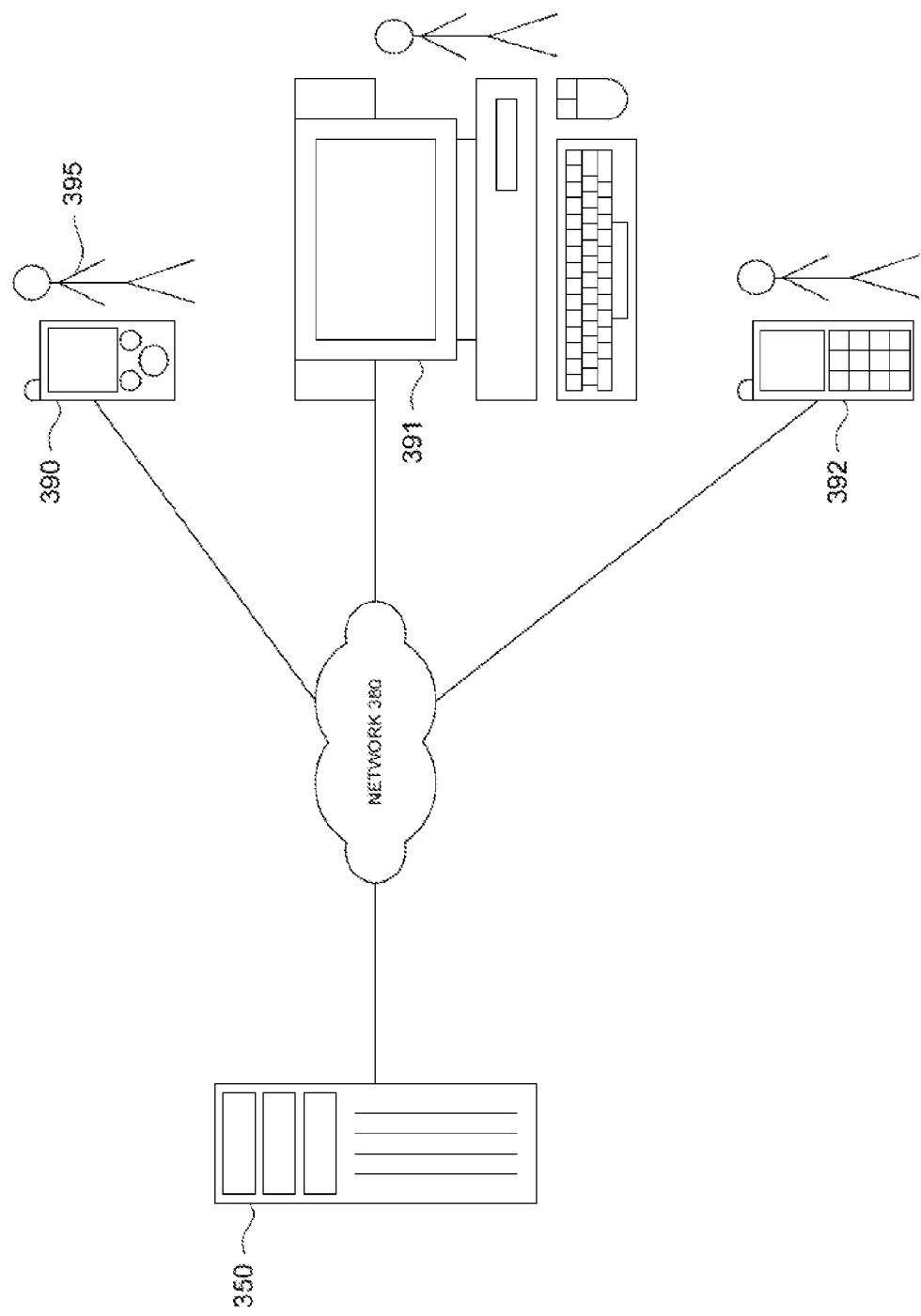

As described above, the load 208 may include a plurality of components. Returning to FIG. 1A, the shelves 114 of rack 110 may receive components 130-132. In one example, component 130 may be a dedicated storage device, for example, including any type of memory capable of storing information accessible by a processor, such as a hard-drive, memory card, ROM, RAM, DVD, CD-ROM, or solid state memory. In another example, component 131 may be a preprogrammed load which draws power from the main bus bar in order to test the operation of the system 100. In yet another example, shown in FIG. 3A, component 132 may be a computer including a processor 330, memory 340 and other components typically present in general purpose computers. In a further example, component 130 or 131 may include a computer configured similarly to computer 132, having a processor, memory, and instructions, or may be a dedicated memory. In this regard, rack 110 and components 130-132, may actually comprise part or all of a load balanced server array 350 of FIG. 3B.

Server array 350 may be at one node of a network 380 and capable of directly and indirectly communicating with other nodes of the network. For example, these computers may exchange information with different nodes of a network for the purpose of receiving, processing and transmitting data to one or more client devices 390-92 via network 380. In this regard, server array 350 may transmit information for display to user 395 on display of client device 390. In this instance, the client devices will typically still be at different nodes of the network than any of the computers, memories, and other devices comprising server array 350.

The server array 350 and client computers 390-32 are capable of direct and indirect communication, such as over network 380. Although only a few computers are depicted in FIG. 3, it should be appreciated that a typical system can include a large number of connected computers, with each different computer being at a different node of the network 380. The network, and intervening nodes, may comprise various conditions and protocols including the Internet, World Wide Web, intranets, virtual private networks, wide area networks, local networks, private networks using communication protocols proprietary to one or more companies, Ethernet, WiFi (such as 802.11, 802.11b, g, n, or other such standards), and HTTP, and various combinations of the foregoing. Such communication may be facilitated by any device capable of transmitting data to and from other computers, such as modems (e.g., dial-up, cable or fiber optic) and wireless interfaces.

Figure 4C:
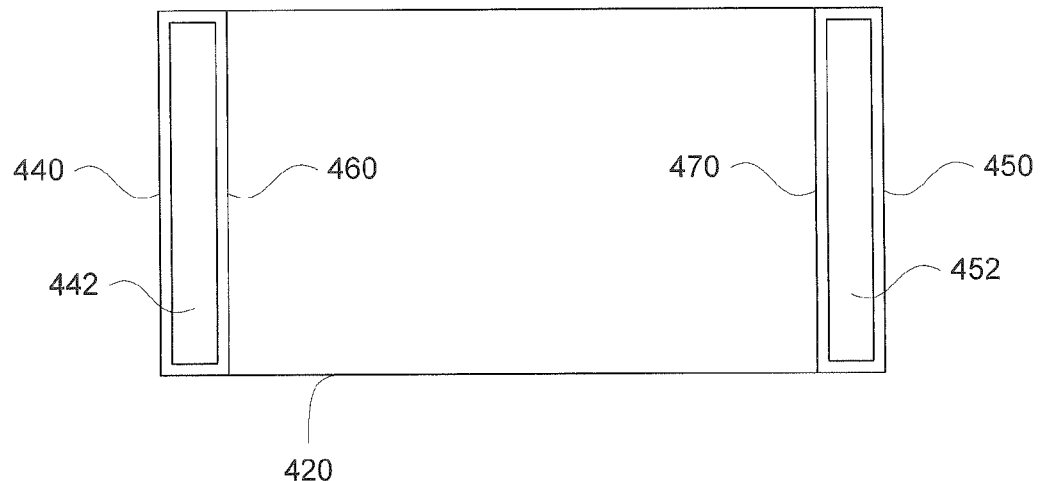

The rack 110 may include a plurality of removable inserts. For example, as shown in FIGS. 4A and 4B, rack 110 includes inserts 410. The rack also includes a base 420, a cap 430, and two sidewalls 440, 450. Sidewalls 440, 450 are depicted in a top-down cross section view of the rack 110 (without inserts) in FIG. 4C and include inner surfaces 460 and 470. Opening 480 is between the inner surfaces 460 and 470.

FIG. 4B depicts a break-away view of the inserts, allowing a view of an inner surface 460. Inner surface 460 may include a plurality of slots 490. Though not shown in detail in this figure, inner surface 460 may have a similar configuration as inner surface 470 including the slots.

Figure 4D:
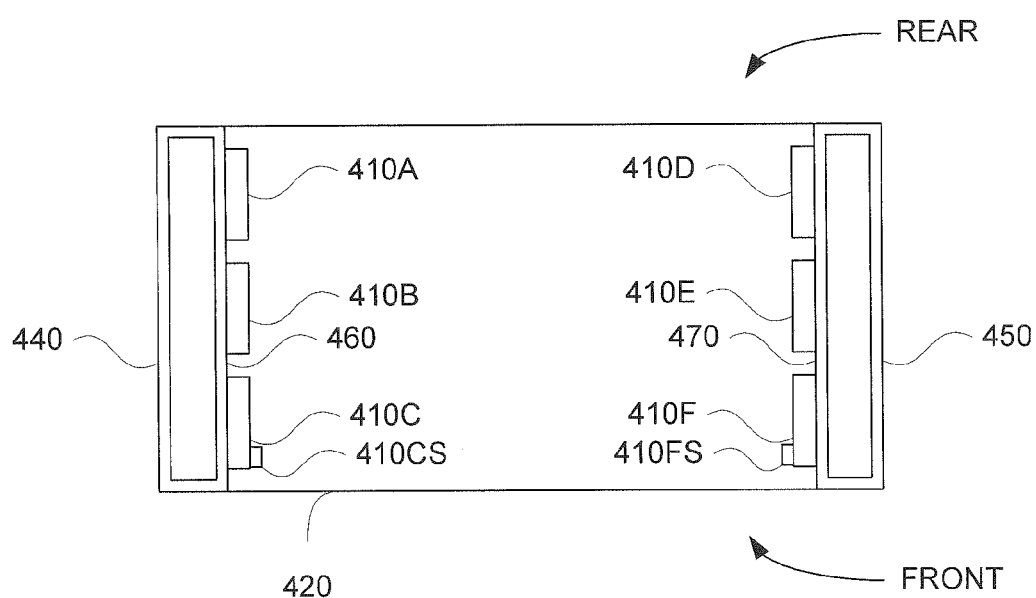

Inserts 410 may be placed along inner surfaces 460, 470 between cap 430 and base 420. For example, in the top-down cross section view of the rack 110 (with inserts) of FIG. 4D depicts inserts 410A-C along inner surface 460 and inserts 410D-F along inner surface 470.

When placed in the rack, each insert may be associated with a corresponding insert. For example, as shown in FIG. 4D, insert 410A is placed opposite of insert 410D, insert 410B is placed opposite of insert 410E, and insert 410C is placed opposite of insert 410F. Accordingly, insert 410A corresponds to inserts 410D, insert 410B corresponds to inserts 410E, and insert 410C corresponds to inserts 410E. While three pairs of inserts are shown, various other configurations using a single pair of inserts, two pairs of inserts, or more than three pairs of inserts may also be used so long as the flanges are configured to support the shelves of the rack.

Figure 5A:
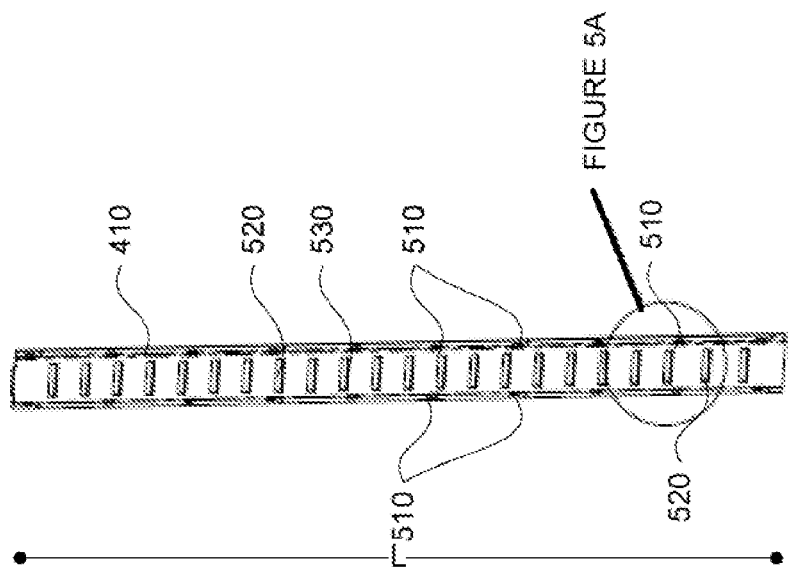
FIGS. 5A-5D are example diagrams of a rack insert in accordance with an implementation.
Figure 5B:
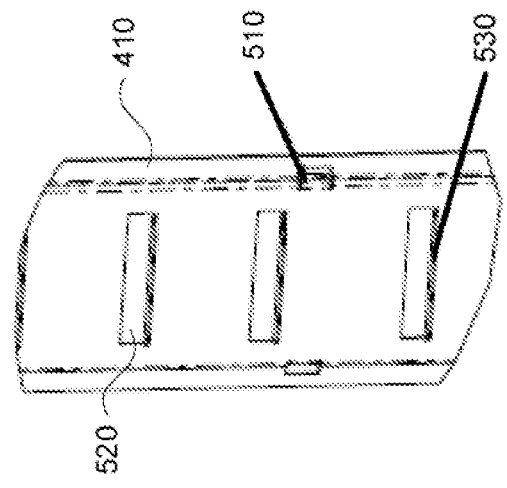

Each insert 410 may include a plurality of hooks, slots, and flanges. For example, FIG. 5A is a view of insert 410 and depicts a plurality of hooks 510, slots 520, and flanges 530. These features are also shown in more detail in FIG. 5B (a partial view of FIG. 5A).

The hooks may be arranged along the length of insert 410 in order to facilitate the installation of the inserts along the sidewalls of the rack. For example, as shown in FIG. 4B, inner sidewall 460 may include a plurality of slots 490. These slots may be configured or arranged in the inner sidewall 460 to receive the hooks 510 of an insert 410.

Figure 5C:
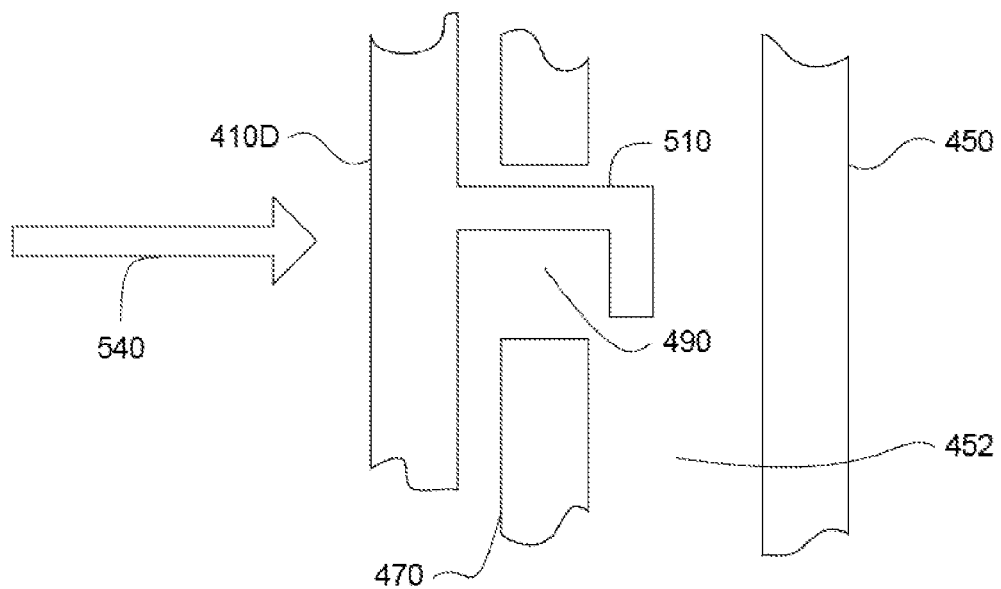
Figure 5D:
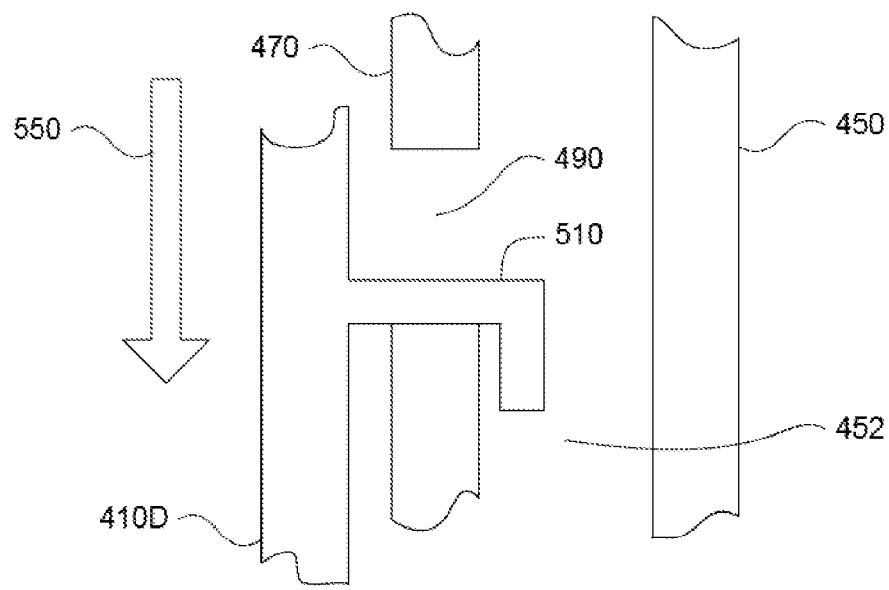

In order to install an insert against the inner sidewall, the hooks 510 of an insert may be lined up and maneuvered through the slots 470. For example, as shown in the side cross section view of sidewall 450 of FIG. 5C, hook 510 of insert 410D may be placed through slot 470 in the direction of arrow 550 and into an interior space 452 of sidewall 450. Returning to FIG. 4C, sidewall 440 may also have an interior space 442 in order to accommodate hooks 510 of inserts 410A-C. The insert 410B may then be then slid from the cap 430 towards the base 420 in the direction of arrow 550 until the hook is supported by the bottom portion of the slot as shown in FIG. 5D. Although only a single corresponding hook and slot are shown, each of the hooks of the insert may be associated with a corresponding slot and placed in the rack in the same manner as shown in FIGS. 5C and 5D. The hooks may hold the insert to the inner sidewall 460 between the cap 430 and the base 420. Thus, the length of the insert may be at least the height of one hook less than the distance between the cap 430 and the base 420. The same effort may be repeated for the installation of a corresponding insert such as insert 410D as well as additional corresponding inserts.

The hook and slot arrangement may allow the inserts to be placed into a rack and removed with relative ease. For example, no significant tools are required to change out the inserts of a rack. Rather, the inserts of a rack may be replaced very quickly by sliding the insert up until the hooks are free from the slots and pulling the insert away from the inner sidewall.

Returning to FIG. 5A, the inserts also include a plurality of flanges. These flanges may be guides sized to receive and support the shelves of the rack. For example, the flanges may be configured at 3.5 inches long and 0.5 inches wide in order to securely support shelves and components on the shelves. If the insert is wider, the flanges may also be longer. Wider or narrower flanges may be used, however, the length of the flanges will be limited by the length of the insert and the weight to be supported by each flange.

The distance between the flanges may define the pitch of the shelves of the rack which, in turn, defines the maximum height of the computing components that may be used on the shelves. Thus, the flange distance may be configured to accommodate the height of the components that will be used on the shelves. FIGS. 6A and 6B, are examples of two inserts, 610 and 620, having flanges spaced at different intervals. In this example, insert 610 may include flanges 612 spaced at distance of length "D" apart, while insert 620 may include flanges 622 spaced a distance of "1.5D" apart. Accordingly, the shelves held in a rack including corresponding pairs of insert 620 may have a height 1.5 times higher than the height of the shelves held in a rack including corresponding pairs of insert 610. As noted above, these distances (and difference in distances) are merely examples. Other inserts with greater or smaller flange distances may also be used.

While different inserts may have different distances between the flanges, the location and distancing of the hooks may be consistent between two sets of inserts for the same rack. Thus, different flange locations may not affect the fit of an insert because the hooks and slots may always have the same configuration. As noted above, the arrangement of the hooks and slots may allow an individual to change the inserts with flanges of one distance to an insert of flanges of another distance very quickly. In effect, the inserts allow a person to very quickly and easily change the configuration and number of the shelves of a rack. This in turn may reduce the need to reengineer a rack or purchase a new rack to fit computing devices with different heights than originally required.

As noted above, each particular insert of an inner sidewall may have a corresponding insert of the opposite inner sidewall. In order to have the shelves be level, the corresponding insert may be selected to have flanges arranged to correspond to the flanges of the particular insert at which shelves will be placed. Thus, the corresponding insert may have flanges spaced at the same distance as that of the particular insert, or may have flanges spaced at some multiple of the distance of the particular insert. For example, insert 610 of FIG. 6A may be used with an identical insert or may also be used with insert 620 of FIG. 6A. However, if inserts 610 and 620 are used together, shelves may only be placed at flanges which correspond. For example, a shelf may be placed on flanges 612 and 622, but not at flanges 614 or 616 and 624. Such a configuration would leave exposed flanges which would reduce the width of the shelf available to hold computing components.

Figure 7A:
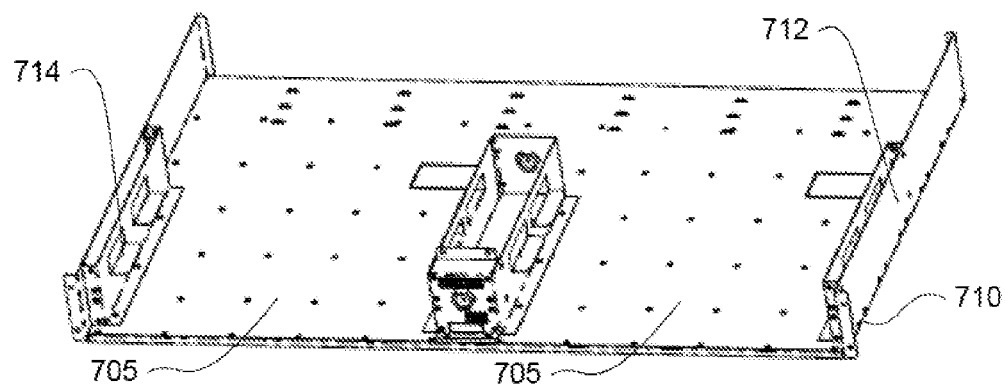
FIGS. 7A-7C are example diagrams of shelves in accordance with implementations.
Figure 7B:
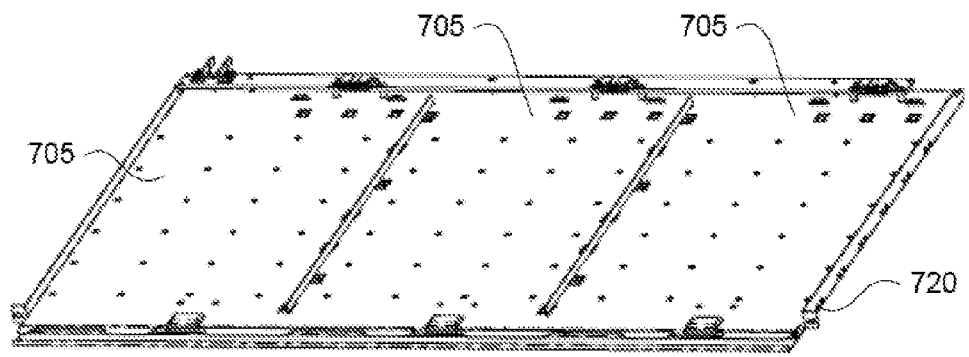
Figure 7C:
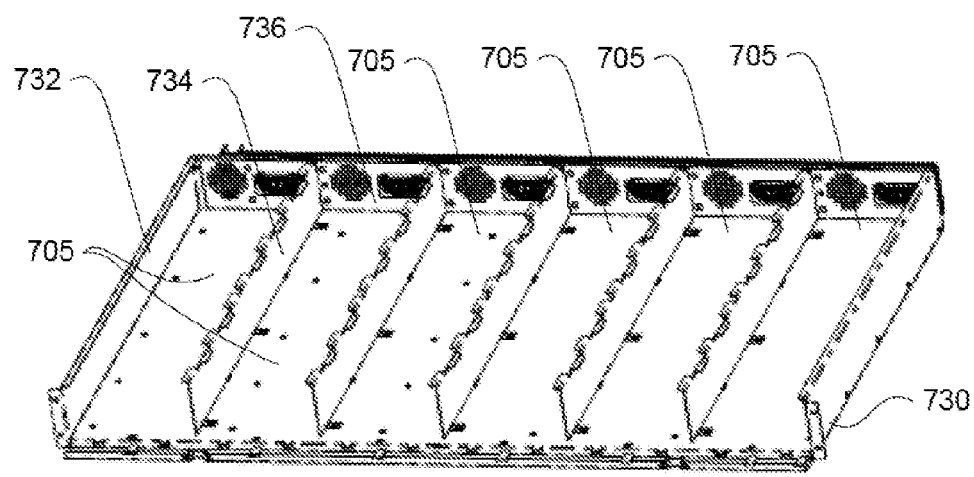

The rack 110 may receive shelves of various configurations. FIGS. 7A-7C depict example diagrams of different configurations of shelves for use with rack 110, each shelf 710, 720, and 730, including a different number of bays 705. For example, shelf 710 is configured with 2 bays, shelf 720 is configured with 3 bays, and shelf 730 is configured with 6 bays. As demonstrated in the figures, the shelves may or may not include features such as sidewalls 712, 732, dividing walls 734, or end walls 736. In some examples, the shelves may also include flanges 714 for receiving and supporting additional shelves. Although only three configurations are depicted in the examples of FIGS. 7A-7C, any number of configurations may be used.

Each of the shelves designed for a particular rack may be associated with substantially similar overall length and width measurements. This provides for differentiation between shelves based upon the features of the shelves and not their overall length and width dimensions. For example, the shelves 710, 720, and 730 may all have the same length and width measurements, but the sidewalls that define the bays create completely different configurations. This allows the shelves to be easily changed out of the same rack without requiring adjustment by the user.

Figure 8:
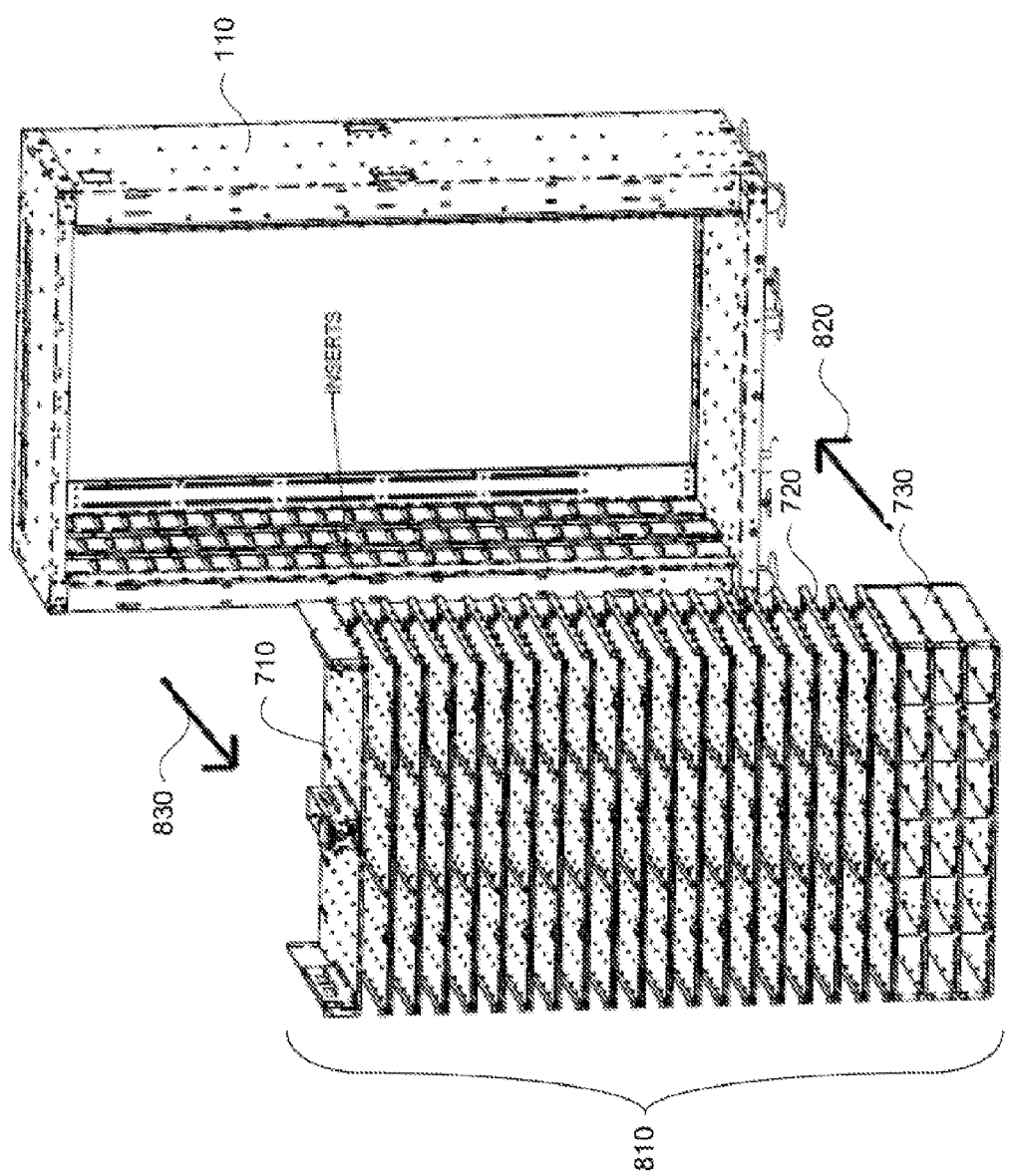
FIG. 8 is an exploded view of shelves and a rack in accordance with an implementation.

Once the inserts are placed into the rack 100 as shown in FIGS. 4A and 4D, the shelves may be slid or placed onto the flanges. For example, as shown in FIG. 8, a plurality of shelves 810 may be slid or placed into the rack 110. Each shelf may be placed on a corresponding set of flanges of the inserts. In order to increase the safety of the shelves, screws may be used to secure each shelf to the inserts. For example, returning to FIG. 4D, the shelves may be inserted into the rack from the front end and slide towards the back end. Once in place, screws 410CS and 410FS may be screwed through a shelf and into the inserts closest to the front end of the rack, here inserts 410C and 410F, in order to further secure the shelves. The flanges may then support the weight of the shelves and the computing components subsequently placed on the shelves, for example, as shown in FIG. 1A.

In order to support the weight of the computing components, the rack, inserts, and shelves themselves may be constructed from various materials. In one example, the rack may be fabricated from 0.060, 0.075, and 0.105 inch thick steel. The inserts may be fabricated from 0.060 inch thick steel, while the shelves may be fabricated from 0.036 inch thick steel. This configuration may support loads of a few hundred pounds, though thicker materials will be able to support larger loads.

Figure 9:
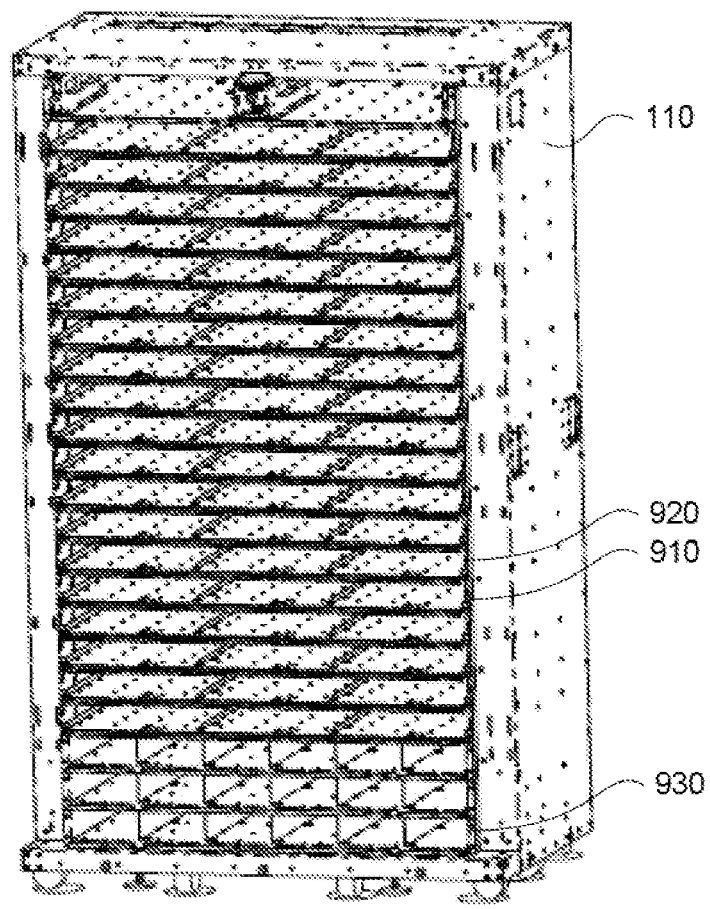
FIG. 9 is another example diagram of shelves and a rack in accordance with an implementation.

A user may then change the configuration of the rack in various ways. In one example, a user may simply remove a shelf. For example, shelf 910 of FIG. 9 sits below shelf 920. By removing shelf 920, the components that may be used on shelf 910 may have a height that is twice as high when shelf 920 is not in the rack 110. This will also reduce the lateral space available for the components, as the flanges no longer supporting a shelf will occupy some of the space available for the components of the shelf below.

In another example, the configuration of the rack 110 may be changed by replacing a shelf. Shelf 930 includes 6 bays. In order to change the configuration of the rack, shelf 930 may be removed, by lifting or sliding the shelf out of the rack 110. A new shelf, such as shelves 710 or 720 with 2 and 3 bays, may then be put in place of shelf 930.

In yet a further example, all of the shelves of a rack may be removed, the inserts may be replaced, and shelves may be inserted back into the rack. For example, the computing components 320-322 of rack 110 (shown in FIG. 1A) may be removed from the rack. Each of the empty shelves may be lifted or slide out of the rack in the direction of arrow 830 as shown in FIG. 8. Returning to FIG. 4A, the inserts may be lifted to release the hooks 510 from the slots 420. Each insert may then be pulled away from the inner sidewall 420 of the rack and removed, leaving an empty rack, as shown in FIG. 1B. The removed inserts may then be replaced with different inserts. For example, the rack may include inserts having the flange distance D of insert 610 of FIG. 6A. These inserts may be removed and replaced with inserts having the flange distance 1.5D of insert 620 of FIG. 6B. Once replaced, new shelves (or the previous shelves) are placed into the rack and supported by the replacement inserts. Because of the different in the flange distances of the inserts, the shelves may now be spaced at 1.5D. Thus, by replacing the flanges, the rack may be reconfigured.

Figure 10:
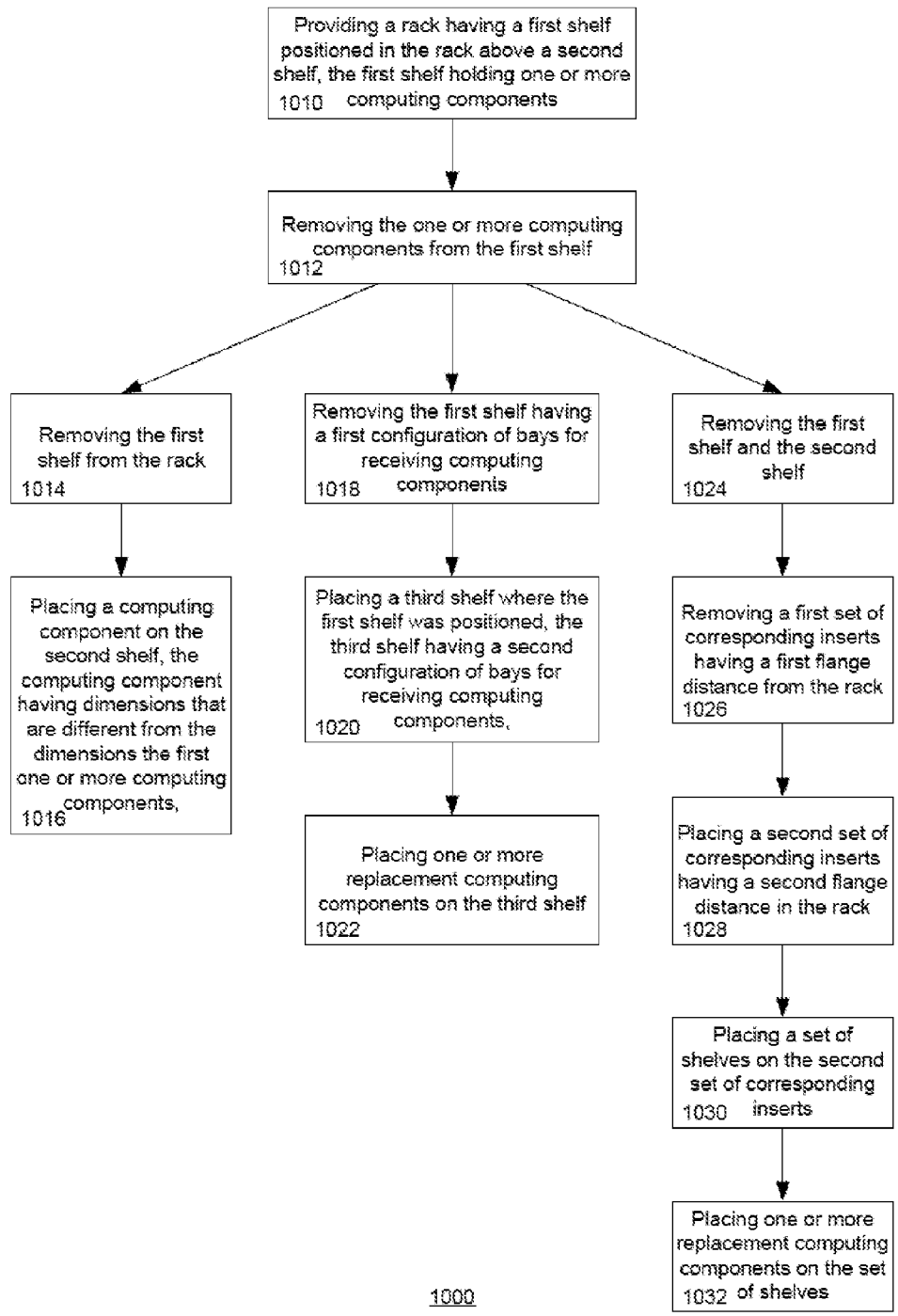
FIG. 10 is an example flow diagram in accordance with an implementation.

Flow diagram 1000 of FIG. 10 depicts various options for reconfiguration of a rack. For example, a rack having a first shelf positioned in the rack above the second shelf may be provided at block 1010. The first shelf holds one or more computing components. At block 1012, the one or more computing components are removed from the first shelf. In a first option, the first shelf may be removed from the rack at block 1014. Next a computing component may be placed on the second shelf at block 1016. This computing component may have different dimensions that the dimensions of the one or more computing components that were removed from the first shelf (see block 1012).

Returning to block 1012, the rack may also be reconfigured by removing the first shelf at block 1018. In this example, the first shelf has a first configuration of bays for receiving computing components. At block 10120, a third shelf is placed where the first shelf was positioned (above the second shelf). This third shelf includes a second configuration of bays for receiving computing components. The second configuration of bays may be different from the first configuration of bays, for example, in number, size, shape, position, features (such as walls, etc.), etc. One or more replacement computing components are placed on the third shelf (for example, in the bay or bays) at block 1022.

In yet another example, returning to block 1012, the first shelf and the second shelf may be removed from the rack at block 1024. A first set of corresponding insets having a first flange distance corresponding to a first shelf height, is removed from the rack at block 1026. A second set of corresponding inserts having a second flange distance corresponding to a second shelf height are placed in the rack at block 1028. A set of shelves is placed on the second set of corresponding inserts at block 1030. One or more replacement computing components are placed on the set of shelves at block 1032.

The use of the inserts and shelves described above allows for user to quickly and simply reconfigure a standard rack into any number of different configurations without requiring specified tools or equipment. As a result, the rack may be reconfigured to adapt to new technologies such as developments in various computing components.

The rack may be packaged together with a plurality of sets of different corresponding inserts. For example, the sets may include inserts with a flange distance of D, 1.5D, and 2D. This may allow a user a plurality of different configurations of shelves for the same rack.

As these and other variations and combinations of the features discussed above can be utilized without departing from the subject matter defined by the claims, the foregoing description of the implementations should be taken by way of illustration rather than by way of limitation of the subject matter defined by the claims. It will also be understood that the provision of the examples disclosed herein (as well as clauses phrased as "such as," "including" and the like) should not be interpreted as limiting the claimed subject matter to the specific examples; rather, the examples are intended to illustrate only one of many possible implementations. Further, the same reference numbers in different drawings may identify the same or similar elements.

The invention claimed is:

1. A kit adapted for assembly into a plurality of different rack configurations for housing one or more computing components, the kit comprising:

a rack including a first side wall having a first inner surface and a second sidewall having a second inner surface, the first and second inner surfaces each including a vertical length greater than a width, the first inner surface including a first plurality of sidewall slots arranged along the vertical length and the width of the first inner surface, and the second inner surface including a second plurality of sidewall slots arranged along the vertical length and the width of the second inner surface, the width of the first and second inner surfaces comprising a depth of the rack; and a first pair of corresponding inserts and a second pair of corresponding inserts, the first and second pairs of corresponding inserts configured to extend along the vertical length of the first and second inner surfaces of the respective first and second sidewalls, and each of the first and second pairs of corresponding inserts further comprising:

a first insert comprising:

an interior surface, an opposed exterior surface, and a thickness extending between the interior and exterior surfaces; a first plurality of hooks extending away from the exterior surface and arranged along a vertical length of the first insert to removably mate with the first plurality of sidewall slots arranged along the first sidewall and to secure the first insert to the first sidewall such that the exterior surface of the first insert faces the first inner surface of the first sidewall; a first plurality of insert slots extending through the thickness and along the vertical length of the first insert; and a first plurality of flanges extending away from the interior surface of the first insert and spaced at a first flange distance away from one another, each insert slot of the first plurality of insert slots corresponding to a flange of the first plurality of flanges, the first plurality of flanges extending outwardly and away from the first plurality of insert slots; and a second insert comprising:
an interior surface, an opposed exterior surface, and a thickness extending between the interior and exterior surfaces; a second plurality of hooks extending away from the exterior surface and arranged along a vertical length of the second insert to removably mate with the second plurality of sidewall slots in the second sidewall and to secure the second insert to the second sidewall such that the exterior surface of the second insert faces the second inner surface of the second sidewall; a second plurality of insert slots extending through the thickness and along the vertical length of the second insert; and a second plurality of flanges extending away from the interior surface of the second insert and spaced at the first flange distance away from one another, each insert slot of the second plurality of insert slots corresponding to a flange of the second plurality of flanges, the second plurality of flanges extending outwardly and away from the second plurality of insert slots, wherein the first insert of the first pair of inserts and the first insert of the second pair of inserts are arranged adjacent one another when secured to the first sidewall, and wherein the first plurality of flanges of the first insert of the first pair of inserts and the first plurality of flanges of the first insert of the second pair of inserts are aligned with one another so as to form a plurality of rows of aligned flanges extending along the depth of the rack, and wherein the first plurality of flanges of the first inserts of the first and second pairs of inserts and the second plurality of flanges of the second inserts of the first and second pair of inserts support shelves of a first height between the first and second inserts of each of the first and second pairs of corresponding inserts.

2. The kit of claim 1, further comprising a second set of shelves, each shelf of the second set of shelves having a different configuration for supporting a computing component, wherein the second set of shelves includes a first shelf of the first height.

3. The kit of claim 2, wherein the set of shelves includes a second shelf of the first height.

4. The kit of claim 1, wherein the rack further includes a bus bar for supplying power to a shelf of the set of shelves.

5. The kit of claim 1, wherein the first and second plurality of hooks of the first and second pairs of inserts are both arranged in a first configuration, and wherein the first and second plurality of sidewall slots are configured to receive and release hooks arranged in the first configuration.

6. A rack assembly for housing one or more computing components, the rack assembly comprising:
a rack including a first side wall having a first inner surface and a second side wall having a second inner surface opposite of the first inner surface, each of the first and second inner surfaces including a vertical length greater than a width, the first inner surface including a first plurality of slots arranged along the vertical length and the width of the first inner surface, and the second inner surface including a second plurality of slots arranged along the vertical length and the width of the second inner surface, the width comprising a depth of the rack;
a first pair of corresponding inserts and a second pair of corresponding inserts, each of the first and second pairs of corresponding inserts including an interior surface and an opposed exterior surface, and respectively extending along the vertical length of one of the respective first and second inner surfaces, each of the first and second pairs of corresponding inserts comprising:
a first insert having a first set of hooks that extend away from the exterior surface and through the first plurality of slots in the first inner surface and removably hold the first insert to the first inner surface, the first insert having a first plurality of flanges that extend away from the interior surface and spaced at a flange distance away from one another, the first plurality of flanges extending outwardly and in a direction toward the second sidewall; and
a second insert having a second set of hooks that extend away from the exterior surface and through the plurality of slots in the second inner surface and removably hold the second insert to the second inner surface, the second insert having a second plurality of flanges that extend away from the interior surface and spaced at the flange distance away from one another, the second plurality of flanges extending outwardly and in a direction toward the first sidewall, wherein the first insert of the first pair of inserts and the first insert of the second pair of inserts are arranged adjacent one another along the first inner surface of the first sidewall, and wherein the first plurality of flanges of the first insert of the first pair of inserts is aligned with the first plurality of flanges of the first insert of the second pair of inserts and forms a plurality of rows of aligned flanges extending along the depth of the first sidewall; and
a shelf positioned within one of the plurality of rows of flanges, the shelf supported at one edge by a flange of the first plurality of flanges of the first pair of inserts and a flange of the first plurality of flanges of the second pair of inserts that are aligned with one another and the shelf supported at another edge by a flange of the second plurality of flanges of the first pair of inserts and a flange of the second plurality of flanges of the second pair of inserts that are aligned with one another.

7. The rack assembly of claim 6, further comprising one or more computing components situated on the shelf.

8. The rack assembly of claim 6, wherein the rack further comprises a cap and a base, wherein the first and second sidewalls have a sidewall length that spans a distance between the cap and the base, and wherein the entire length of the first and second sidewalls is the sidewall length.

9. The rack assembly of claim 6, further comprising a first screw going through the shelf and into the first insert in order to further support the shelf and a second screw going through the shelf and into the second insert in order to further support the shelf.

10. The kit of claim 1, wherein the first insert of the first pair of inserts extends along an entire length of the first inner surface of the rack and wherein the second insert of the first pair of inserts extends along an entire length of the second inner surface of the rack.

11. The kit of claim 1, wherein the first insert of the first pair of inserts has a length less than the entire length of the first inner surface of the first sidewall.

12. The kit of claim 1, wherein the exterior surfaces of the respective first and second inserts of the first and second pair of inserts are configured to face toward the respective first and second inner surfaces when the hooks of the first and second inserts of the first and second pair of inserts are removably mated with the plurality of sidewall slots in the first and second sidewalls.

13. The kit of claim 1, further comprising a third pair of corresponding inserts that include first and second inserts, each of the first and second inserts of the third pair of inserts having a third plurality of hooks, the third plurality of hooks of the first insert of the third pair of corresponding inserts being arranged to removably mate with the plurality of sidewall slots in the first sidewall and the third plurality of hooks of the second insert of the third pair of inserts being arranged to removably mate with the plurality of sidewall slots in the second sidewall, each of the first and second inserts of the third pair of inserts further having a first surface, an opposed second surface, a thickness extending between the first and second opposed surfaces of the third pair of inserts, a third plurality of insert slots extending through the thickness of the third pair of corresponding inserts, and a third plurality of flanges spaced at a second flange distance away from one another for accommodating shelves of a second height, each insert slot of the third plurality of insert slots corresponding to a flange of the third plurality of flanges, the third plurality of flanges extending outwardly and away from the third plurality of insert slots, and the second flange distance being different from the first flange distance.

14. The kit of claim 1, further comprising a third pair of corresponding inserts that includes first and second inserts, each of the first and second inserts of the third pair of inserts having a third plurality of hooks, the third plurality of hooks of the first insert of the third pair of inserts being arranged to removably mate with some of the first plurality of sidewall slots in the first sidewall and the third plurality of hooks of the second insert of the third pair of inserts being arranged to removable mate with some of the second plurality of sidewall slots in the second sidewall, the first and second inserts of the third pair of inserts each further including a first surface, an opposed second surface, a thickness extending between the first and second opposed surfaces of the third pair of inserts, a third plurality of insert slots extending through the thickness of the third pair of inserts, and a third plurality of flanges spaced at the distance away from one another, the third plurality of flanges extending outwardly and away from the third plurality of insert slots, wherein the first insert of the third pair of inserts is configured to be arranged along the depth of the first sidewall adjacent the respective first inserts of the first and second pairs of inserts such that the third plurality of flanges of the first insert of the third pair of inserts are aligned with both the first plurality of flanges of the first insert of the first pair of inserts and the first plurality of flanges of the first insert of the second pair of inserts.

15. The rack assembly of claim 1, further comprising a third pair of corresponding inserts that includes first and second inserts, each of the first and second inserts of the third pair of inserts having a third plurality of hooks, the third plurality of hooks being arranged to removably mate with some of the first plurality of sidewall slots in the respective first sidewall and the second plurality of sidewalls slots in the second sidewall, the first and second inserts of the third pair of inserts each further including a first surface, an opposed second surface, a thickness extending between the first and second opposed surfaces of the third pair of inserts, a third plurality of insert slots extending through the thickness of the third pair of inserts, and a third plurality of flanges spaced at the distance away from one another, the third plurality of flanges extending outwardly and away from the third plurality of insert slots, wherein the first insert of the third pair of inserts is configured to be arranged along the depth of the first sidewall adjacent the respective first inserts of the first and second pairs of inserts such that the third plurality of flanges of the first insert of the third pair of inserts are aligned with both the first plurality of flanges of the first insert of the first pair of inserts and the first plurality of flanges of the first insert of the second pair of inserts.

* * * * *